US006909261B2

(12) United States Patent
Laig-Horstebrock et al.

(10) Patent No.: US 6,909,261 B2
(45) Date of Patent: Jun. 21, 2005

(54) METHOD FOR PREDICTING THE LOADING CAPABILITY OF AN ELECTROCHEMICAL ELEMENT

(75) Inventors: Helmut Laig-Horstebrock, Frankfurt (DE); Eberhard Meissner, Wunstorf (DE)

(73) Assignee: VB Autobatterie GmbH, Hannover (DE)

( * ) Notice: Subject to any disclaimer, the term of this patent is extended or adjusted under 35 U.S.C. 154(b) by 361 days.

(21) Appl. No.: 10/157,508

(22) Filed: May 29, 2002

(65) Prior Publication Data

US 2003/0001581 A1 Jan. 2, 2003

(30) Foreign Application Priority Data

Jun. 1, 2001 (DE) ......................................... 101 26 891

(51) Int. Cl.⁷ .............................................. H01M 10/44
(52) U.S. Cl. ...................................... 320/132; 324/433
(58) Field of Search ................................ 324/431, 426, 324/427, 430, 433; 320/132, 149

(56) References Cited

U.S. PATENT DOCUMENTS

| | | | |
|---|---|---|---|
| 3,906,329 | A | 9/1975 | Bader |
| 4,153,867 | A | 5/1979 | Jungfer et al. |
| 4,193,025 | A | 3/1980 | Frailing et al. |
| 4,207,611 | A | 6/1980 | Gordon |
| 4,322,685 | A | 3/1982 | Frailing et al. |
| 4,595,880 | A | 6/1986 | Patil |
| 4,642,600 | A | 2/1987 | Gummelt et al. |
| 4,659,977 | A | 4/1987 | Kissel et al. |
| 4,665,370 | A | 5/1987 | Holland |
| 4,719,427 | A | 1/1988 | Morishita et al. |
| 4,816,736 | A | 3/1989 | Dougherty et al. |
| 4,876,513 | A | 10/1989 | Brilmyer et al. |
| 4,888,716 | A | 12/1989 | Ueno |
| 4,937,528 | A | 6/1990 | Palanisamy |
| 4,943,777 | A | 7/1990 | Nakamura et al. |
| 4,952,861 | A | 8/1990 | Horn |
| 5,002,840 | A | 3/1991 | Klebenow et al. |
| 5,032,825 | A | 7/1991 | Kuznicki |
| 5,055,656 | A | 10/1991 | Farah et al. |
| 5,079,716 | A | 1/1992 | Lenhardt et al. |
| 5,130,699 | A | 7/1992 | Reher et al. |
| 5,159,272 | A | 10/1992 | Rao et al. |
| 5,162,164 | A | 11/1992 | Dougherty et al. |
| 5,204,610 | A | 4/1993 | Pierson et al. |
| 5,223,351 | A | 6/1993 | Wruck |
| 5,280,231 | A | 1/1994 | Kato et al. |

(Continued)

FOREIGN PATENT DOCUMENTS

| | | |
|---|---|---|
| DE | 22 42 410 | 3/1973 |
| DE | 2 242 510 C3 | 4/1974 |
| DE | 25 11 426 A1 | 9/1975 |
| DE | 33 34 128 A1 | 4/1985 |
| DE | 37 12 629 C2 | 10/1987 |
| DE | 38 82 374 T2 | 2/1989 |
| DE | 38 08 559 A1 | 9/1989 |
| DE | 39 01 680 A1 | 3/1990 |
| DE | 40 07 883 A1 | 9/1991 |
| DE | 44 14 134 A1 | 11/1994 |
| DE | 43 39 568 | 5/1995 |
| DE | 689 24 169 T2 | 3/1996 |
| DE | 195 40 827 A1 | 5/1996 |
| DE | 195 43 874 | 5/1996 |
| DE | 197 50 309 A1 | 5/1999 |
| DE | 691 31 276 T2 | 12/1999 |
| DE | 198 47 648 A1 | 4/2000 |
| DE | 694 23 918 T2 | 8/2000 |
| DE | 199 52 693 A1 | 5/2001 |
| DE | 199 60 761 C1 | 5/2001 |
| DE | 93 21 638 U1 | 8/2001 |
| DE | 100 21 161 A1 | 10/2001 |
| DE | 699 00 638 T2 | 8/2002 |
| EP | 0 516 336 B1 | 2/1992 |
| EP | 1 116 958 A2 | 7/2001 |
| EP | 1 120 641 A2 | 8/2001 |
| WO | WO 97/15839 | 5/1997 |
| WO | WO 99 17128 | 4/1999 |
| WO | WO 99 66340 | 12/1999 |
| WO | WO 00/04620 | 1/2000 |
| WO | WO 01 15023 | 3/2001 |
| WO | WO 03/001224 A1 | 1/2003 |

OTHER PUBLICATIONS

Willibert Schleuter, *Das elektrische Ersatzschaltbild des Bleiakkumulators unter Berücksichtigung erzwungener Elektrolytströmung*, etz Archiv, vol. 4 (1982), Issue 7, pp. 213–218.

P. Lürkens et al., *Ladezustandsschätzung von Bleibatterien mit Hilfe des Kalman–Filters*, etz Archiv, vol. 8 (1986), Issue 7, pp. 231–236.

(Continued)

*Primary Examiner*—Edward H. Tso
(74) *Attorney, Agent, or Firm*—Foley & Lardner LLP (57) ABSTRACT

A method for predicting the loading capability of an accumulator by measuring the current I, voltage U and temperature T of the accumulator, and comparing the measured values with the corresponding values of the response of an equivalent circuit diagram of the accumulator, the parameters of the components of the equivalent circuit diagram and the state variables are varied so that a match with the measured values is obtain. The loading capability is deduced from the matched parameters and state variables determined in this way. The equivalent circuit diagram has the form $-U_o-R-C_S-$ and the input voltage $U'$ of the equivalent circuit diagram is a voltage that is corrected with respect to the measured battery voltage U, the correction function containing as variables only the current I, the voltage U and the temperature T and as a nonlinear term a logarithmic dependency on I. By using the equivalent circuit diagram, the instantaneous loading capability, i.e., the response of the battery under a hypothetical load with an assumed current value I, is predicted by imposing this current value I on the equivalent circuit diagram with the found parameters and evaluating the voltage response calculated.

22 Claims, 3 Drawing Sheets

U.S. PATENT DOCUMENTS

| | | | |
|---|---|---|---|
| 5,281,919 A | 1/1994 | Palanisamy | |
| 5,316,868 A | 5/1994 | Dougherty et al. | |
| 5,321,627 A | 6/1994 | Reher | |
| 5,352,968 A | 10/1994 | Reni et al. | |
| 5,381,096 A | 1/1995 | Hirzel | |
| 5,404,129 A | 4/1995 | Novak et al. | |
| 5,412,323 A | 5/1995 | Kato et al. | |
| 5,416,402 A | 5/1995 | Reher et al. | |
| 5,428,560 A | 6/1995 | Leon et al. | |
| 5,439,577 A | 8/1995 | Weres et al. | |
| 5,488,283 A | 1/1996 | Dougherty et al. | |
| 5,549,984 A | 8/1996 | Dougherty | |
| 5,552,642 A | 9/1996 | Dougherty et al. | |
| 5,563,496 A | 10/1996 | McClure | |
| 5,572,136 A | 11/1996 | Champlin | |
| 5,578,915 A | 11/1996 | Crouch, Jr. et al. | |
| 5,656,915 A | 8/1997 | Eaves | |
| 5,680,050 A | 10/1997 | Kawai et al. | |
| 5,698,965 A | 12/1997 | York | |
| 5,721,688 A | 2/1998 | Bramwell | |
| 5,744,936 A | 4/1998 | Kawakami | |
| 5,744,963 A | 4/1998 | Arai et al. | |
| 5,761,072 A | 6/1998 | Bardsley, Jr. et al. | |
| 5,773,977 A | 6/1998 | Dougherty | |
| 5,808,367 A | 9/1998 | Akagi et al. | |
| 5,808,445 A * | 9/1998 | Aylor et al. | 320/132 |
| 5,818,116 A | 10/1998 | Nakae et al. | |
| 5,818,333 A | 10/1998 | Yaffe et al. | |
| 5,896,023 A | 4/1999 | Richter | |
| 5,898,292 A | 4/1999 | Takemoto et al. | |
| 5,936,383 A | 8/1999 | Ng et al. | |
| 5,965,954 A | 10/1999 | Johnson et al. | |
| 5,977,654 A | 11/1999 | Johnson et al. | |
| 5,990,660 A | 11/1999 | Meissner | |
| 6,016,047 A | 1/2000 | Notten et al. | |
| 6,037,749 A | 3/2000 | Parsonage | |
| 6,037,777 A | 5/2000 | Champlin | |
| 6,057,666 A | 5/2000 | Dougherty et al. | |
| 6,087,808 A | 7/2000 | Pritchard | |
| 6,091,325 A | 7/2000 | Zur et al. | |
| 6,118,252 A | 9/2000 | Richter | |
| 6,118,275 A | 9/2000 | Yoon et al. | |
| 6,144,185 A | 11/2000 | Dougherty et al. | |
| 6,160,382 A | 12/2000 | Yoon et al. | |
| 6,222,341 B1 | 4/2001 | Dougherty et al. | |
| 6,268,712 B1 | 7/2001 | Laig-Horstebrock et al. | |
| 6,271,642 B1 | 8/2001 | Dougherty et al. | |
| 6,296,593 B1 | 10/2001 | Gotou et al. | |
| 6,300,763 B1 * | 10/2001 | Kwok | 324/427 |
| 6,304,059 B1 | 10/2001 | Chalasani et al. | |
| 6,331,762 B1 | 12/2001 | Bertness | |
| 6,369,578 B1 | 4/2002 | Crouch, Jr. et al. | |
| 6,388,421 B2 | 5/2002 | Abe | |
| 6,388,450 B2 | 5/2002 | Richter et al. | |
| 6,392,389 B1 | 5/2002 | Kohler | |
| 6,392,414 B2 | 5/2002 | Bertness | |
| 6,392,415 B2 | 5/2002 | Laig-Horstebrock et al. | |
| 6,417,668 B1 | 7/2002 | Howard et al. | |
| 6,424,157 B1 | 7/2002 | Gollomp et al. | |
| 6,441,585 B1 | 8/2002 | Bertness | |
| 6,445,158 B1 | 9/2002 | Bertness et al. | |
| 6,452,361 B2 | 9/2002 | Dougherty et al. | |
| 6,472,875 B1 | 10/2002 | Meyer | |
| 6,495,990 B2 | 12/2002 | Champlin | |
| 6,507,194 B2 | 1/2003 | Suzuki | |
| 6,515,452 B2 | 2/2003 | Choo | |
| 6,515,456 B1 | 2/2003 | Mixon | |
| 6,522,148 B2 | 2/2003 | Ochiai et al. | |
| 6,534,992 B2 | 3/2003 | Meissner et al. | |
| 6,556,019 B2 | 4/2003 | Bertness | |
| 6,600,237 B1 | 7/2003 | Meissner | |
| 6,600,293 B2 | 7/2003 | Kikuchi | |
| 6,608,482 B2 | 8/2003 | Sakai et al. | |
| 6,653,818 B2 | 11/2003 | Laig-Horstebrock et al. | |
| 2002/0008495 A1 | 1/2002 | Dougherty et al. | |
| 2002/0026252 A1 | 2/2002 | Wruck et al. | |
| 2002/0031700 A1 | 3/2002 | Wruck et al. | |
| 2003/0047366 A1 | 3/2003 | Andrew et al. | |
| 2003/0082440 A1 | 5/2003 | Mrotek et al. | |
| 2003/0142228 A1 | 7/2003 | Flach et al. | |
| 2003/0236656 A1 | 12/2003 | Dougherty | |
| 2004/0021468 A1 | 2/2004 | Dougherty et al. | |

OTHER PUBLICATIONS

Intelec '88—Tenth International communications Energy Conference, "A look at the Impedance of a Cell—S.L. DeBardelaben, New York Telephone Company," bearing a designation "Oct. 30–Nov. 2, 1988." (6 sheets).

Battery Alert, Ltd., "The Easy–to–Install Battery Deterioration Warning Device", 12 Volt Model (BA101) Advertisement (2 sheets).

Journal of Applied Electrochemistry, vol. 10 No. 1, Jan. 1980—The Impedance of Electrical Storage Cells—N.A. Hampson, s.A.G.R. Karunathilaka, Department of Chemistry, R. Leek, Department of Electronic and Electrical Engineering, University of Technology, Loughborough, Lieces­tershire, UK (11 sheets).

Battery Evaluation Reports, s.e. Ross Laboratories, Inc., Apr. 1999 (1 page).

HSR–003 Application Notes, Hermetic Switch, Inc., Highway 92, Post Office Box 2220, Chickasha, OK 73023, http://www.hermeticswitch.com/RS_frm.htm, available at least by Jan. 6, 2003 (1 page).

How It Works: Reed Switch Motor, http://members.tripod.com/simplemotor/rsmotor.htm, available at least by Jan. 6, 2003, 4 pages.

Reed Relay Technical & Application Information, COTO Technology, 55 Dupont Drive, Providence, RI, pgs. http://www.colorelay.com/ReedTech.pdf, available at least by Jan. 6, 2003, 37–43.

Brooke, L., "Resin Keeps Batteries Cool", A1 Inside Magazine, Nov., 1998, p. 55.

Hoover, J., "Failure Modes of Batteries Removed from Service", A Presentation at the 107th Convention of Battery Council International, Apr. 30–May 3, 1995, p. 62.

Stan Gibilisco and Neil Sclater, Co–Editors–in–Chief, "Rectifier Bridge," Encyclopedia of Electronics, 2nd Edition, TAB Professional and Reference Books, 1996, pp. 708–711.

Lehman, A., "Electrical Battery Model For Leo Application Based on Absolute Instantaneous State of Charge," Proceedings of the European Space Power Conference held in Madrid, Spain, Oct. 2–6, 1989, ESA Publications, NL, vol. 1, pp. 173–178.

Robbins, Tim & Hawkins, John, "Battery Model For Over–Current Protection Simulation of DC Distribution Systems," Telecommunications Energy Conference, 1994, Intelec '94, 16th International Vancouver, BC, Canada Oct. 30–Nov. 3, 1994, New York, NY, IEEE, pp. 307–314 XP001036407 ISBN: 0–7803–2034–4.

Mayer, D. et al., "Modelling and Analysis of Lead Acid Battery Operation," Ecole des Mines de Paris, XP010092137, pp. 1–3.

Mauracher, P. & Karden, E., "Dynamic Modelling of Lead/Acid Batteries Using Impedance Spectroscopy for Parameter Identification," Journal of Power Sources, Elsevier Sequoia S.A., Lausanne, Ch., vol. 67 (1997) No. 1–2, pp. 69–84, XP004095174 ISSN: 0378–7753, p. 70, line 11: p. 82, line 5, figures 2, 3, 12.

Baert, D & Vervaet, A., "Lead–Acid Battery Model for the Derivation of Peukert's Law," Electrochimica Acta, Elsevier Science Publishers, Barking, GB, vol. 44, No. 20, pp. 3491–3504 XP004168624 ISSN: 0013–4686.

International Search Report for PCT/US02/19760 (international filing date Jun. 21, 2002), date of mailing Oct. 10, 2002.

Conference Proceedings, Intelec '86—International Telecommunications Energy Conference, Determining the End of Battery Life—Sheldon DeBardelaben, New York Telephone Company, bearing a designation "Oct. 19–22, 1986." (6 sheets).

Bosch and the New E–Class, Electronic Battery Management System, Focus on Electronics, Nov. 2002 (1 sheet).

Forecast Review, The Battery Man, Nov., 1996 p. 21.

OnGuard™ XT Battery State-of-Health Monitor, 2003 Midtronics, Inc. P/N 156–983A (2 sheets).

* cited by examiner

METHOD FOR PREDICTING THE LOADING CAPABILITY OF AN ELECTROCHEMICAL ELEMENT

RELATED APPLICATION

This application claims priority of German Patent Application No. DE 101 26 891.2, filed Jun. 1, 2001.

FIELD OF THE INVENTION

This invention relates to a method for predicting the loading capability of an electrochemical element/battery by measuring the current I, voltage U and temperature T of the electrochemical element, and comparing the measured values with corresponding values of the response of an equivalent circuit diagram of the electrochemical element, the parameters of the components of the equivalent circuit diagram and the state variables being varied so that a match with the measured values is obtained and so that the loading capability is determined from the matched parameters and state variables.

BACKGROUND

For the use of batteries in applications with a high requirement for reliability, e.g., in vehicles, in which components of the brake or steering system are to be supplied with electricity, secure prediction regarding the instantaneous performance of the batteries is indispensable. It is, therefore, necessary to predict whether critical battery loading of the battery, occurring in the near future, can also be sustained.

For a battery, it is known (Willibert Schleuter: etzArchiv volume 4 (1982) issue 7, pages 213–218; P. Lürkens, W. Steffens: etzArchiv volume 8 (1986) issue 7, pages 231–236) to assume an equivalent circuit diagram whose parameters are trained by analyzing the battery response during operation, and which then makes it possible to predict the future response. To that end, it is necessary to register the voltage and current of the battery constantly, and process them, e.g., in a computer.

It would accordingly be advantageous to predict the likely voltage response of an electrical accumulator under given loading with an electrical current or an electrical power. To that end, it would be advantageous to have an equivalent electrical circuit diagram which, on the one hand, is accurate enough to describe details of the voltage response. On the other hand, it would also be advantageous to keep its number of free parameters, which need to be matched during operation, as small as possible to permit quick and unequivocal matching.

SUMMARY OF THE INVENTION

This invention relates to a method for predicting loading capability of a battery including measuring current I, voltage U and temperature T of the battery, forming an equivalent circuit with an equivalent circuit diagram -Uo-R-$C_S$-, wherein Uo is voltage at t=o, R is resistance and $C_S$ is capacitance, correcting input voltage U' of the equivalent circuit diagram with respect to measured battery voltage U, the correcting containing as variables only current I, voltage U and temperature T and as a nonlinear term a logarithmic dependency on I, varying parameters of components of the equivalent circuit diagram and state variables, comparing measured values with corresponding values of responses of the equivalent circuit diagram of the battery, and determining the loading capability from matched parameters and state variables.

DETAILED DESCRIPTION

The method according to the invention is firstly suitable for electrochemical accumulators, i.e., so-called "secondary elements" or batteries, which can be repeatedly discharged and recharged. The invention is not restricted to these, however, but can also be used in non-rechargeable electrochemical elements, so-called "primary elements" or batteries. An accumulator will be discussed below, without intending thereby to restrict the invention to secondary elements.

The idea according to the invention is that an equivalent circuit diagram with a particularly favorable form is set up;

the parameters of this equivalent circuit diagram are continuously optimized by matching to continuously recorded measured values; and by using the equivalent circuit diagram and the optimized parameters, the instantaneous loading capability, i.e., the response of the battery under a hypothetical load with an assumed current value I, is predicted by imposing this current value I on the equivalent circuit diagram with the found parameters and evaluating the voltage response calculated.

Figure 1:
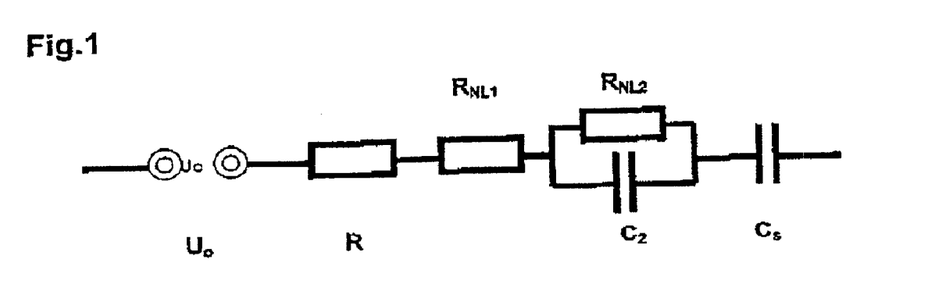
FIG. 1 is an equivalent circuit diagram which may be utilized in accordance with aspects of the invention.

This is based on an equivalent circuit diagram for the response of the voltage U of the accumulator of the form represented in FIG. 1

$$-Uo\text{-}R\text{-}R_{NL1}\text{-}(R_{NL2}//C_2)\text{-}C_S\text{-}, \tag{1}$$

wherein Uo is the zero-current voltage, R is a resistance, and $C_2$ and $C_S$ are capacitances.

The core of the invention is an improvement to the treatment of the nonlinear terms of the equivalent circuit diagram. The nonlinear terms $R_{NL1}$ and $R_{NL2}$ can be optimally represented in the form of a dependency of the current i on the voltage u. A simplified form of the Butler-Volmer equation known from electrochemistry is then employed:

$$i = io^* \sin h(u/\hat{u}), \tag{2}$$

with the so-called "exchange current density" io (dimension: current) and the so-called "Tafel slope" $\hat{u}$ (dimension: voltage).

Eq. 2 will be used below in the approximation for fairly large currents (i>io):

$$u(i) = \hat{u}^* \ln(2/io) + \hat{u}^* \ln(i)$$

or in the short form with Uo'=û*ln(2/io):

$$u(u)=Uo'+\hat{u}*\ln(i)$$

Normally, it is, therefore, necessary for the parameters Uo, R, $C_2$, $C_S$ of the equivalent circuit diagram and, for each of the nonlinear resistances $R_{NL1}$ and $R_{NL2}$, io and û as well, to be "trained" from the current and voltage responses in the battery.

Advantageous for good "training" are fairly large current variations (which usually occur, for example, during operation of the accumulator in a vehicle), as well as properties of the electrochemical system in question that possibly need to be taken into account. In the case of a lead-acid accumulator, for example, it is necessary for a sufficiently long phase with a persistent negative charge balance to occur.

A further precondition is that the nature of the critical load to be predicted be known, so that it is possible to calculate the situation in advance.

Explicit knowledge of the instantaneous state of charge (SOC) of the accumulator, however, is not generally necessary.

The better an equivalent circuit diagram and the functions used to describe nonlinear components represent the battery situation, the more accurate a prediction can be.

It has been shown that the method of this invention satisfies this condition very well, especially in the discharge range of lead-acid accumulators.

In practice, finding the parameters of the nonlinear elements of the equivalent circuit diagram constitutes the greatest problem numerically, especially when the measurement accuracy of the large current and voltage is limited by measurement noise. This is the case, in particular, whenever the value range of the measured quantities is too small.

The method according to the invention overcomes these problems. It resorts to the practical experience that in many battery systems (for example in lead-acid accumulators, lithium cells, NiCd cells) the voltage response of the nonlinear elements at fairly high currents can be represented as a function of the current i by a relationship of the form $$U_{NL}=Uo'+\hat{u}*\ln(i). \quad (3)$$

In this case, û, the Tafel slope of Eq. 2, is a constant which may depend to a greater or lesser extent also on the temperature according to the battery system.

Figure 2:
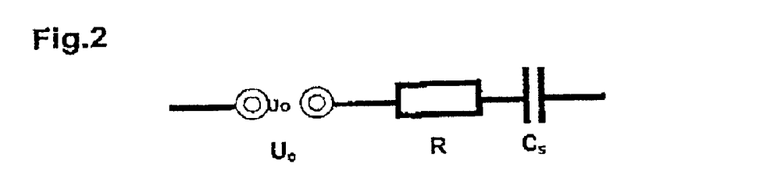
FIG. 2 is another circuit diagram that may be used in conjunction with selected aspects of the invention.

The method according to the invention includes specifying the nonlinear elements in a fixed way as functions û*ln(i) dependent only on the current. In other words: parameter matching for the voltage U of the accumulator is carried out not on the complete equivalent circuit diagram in FIG. 1, but only on a reduced equivalent circuit diagram of the form represented in FIG. 2

$$-Uo-R-C_S-, \quad (4)$$

although instead of the measured battery voltage U, the corrected quantity $U+U_{NL}$ is applied to take into account the nonlinear terms, that is to say a term of the form $$U'=U+\hat{u}*\ln(i) \quad (4a)$$

in the aforementioned simplest case, with the approximation mentioned above for fairly large currents i>io being used.

Instead of the many parameters of the equivalent circuit diagram represented in FIG. 1, some of which are difficult to match unequivocally because of their strong correlation, only the three parameters Uo, R, $C_S$, hence, need to be matched according to the invention. The Tafel slope û is specified as an optionally temperature-dependent quantity, and is not matched.

The input voltage U' of the equivalent circuit diagram is, hence, a voltage that is corrected with respect to the measured battery voltage U and the correction function contains as variables only the current I, the voltage U and the temperature T and as a nonlinear term a logarithmic dependency on I. By using the equivalent circuit diagram, the instantaneous loading capability, i.e., the response of the battery under a hypothetical load with an assumed current value I, is predicted by imposing this current value I on the equivalent circuit diagram with the found parameters and evaluating the voltage response calculated.

Numerical values for a lead-acid accumulator will be indicated below by way of example. The claimed method also applies, with modified numerical values, to other battery systems.

For a 6-cell battery unit, the value of û lies, e.g., at approximately 0.1 V, and can be selected approximately from the 0.02 to 0.3 V range. The preferred value lies at about 0.13 V, i.e., about 21 mV per cell. The parameter û generally lies in the value range of from about 5 to about 50 mV per cell, preferably in the value range of from about 10 to about 30 mV per cell.

Figure 3:
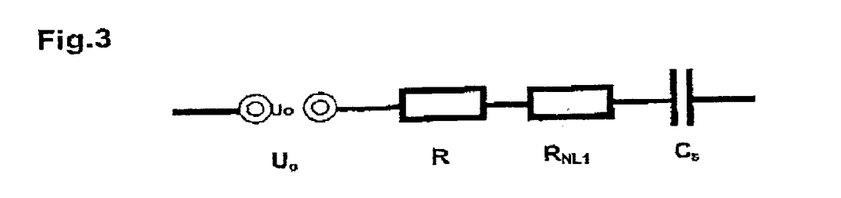
FIG. 3 is yet another circuit diagram that may be used in conjunction with selected aspects of the invention.

For slow load changes on the battery (for instance less than about 0.1 Hz), the method can already be used well in this form with only one nonlinear term. The underlying equivalent circuit diagram in FIG. 3 is a simplification of that represented in FIG. 1, with the nonlinear term $R_{NL1}$ being catered for by the correction of the voltage.

For faster changes, a further improvement is possible by taking two nonlinear terms $R_{NL1}$ and $R_{NL2}//C_2$ into account according to the equivalent circuit diagram represented in FIG. 1.

$$U_{NL}=Uo'+\hat{u}_1*\ln(i)+\hat{u}_2*\ln(\hat{i}_2) \quad (5)$$

in which $\hat{i}_2$ is a current value low-pass filtered from the current value i with a time constant $$\tau_2=a_2*Q/\hat{i}_2. \quad (5a)$$

In this case, the time constant $\tau_2$ for the filtered current $\hat{i}(t)$ at time t is calculated using the previous value of the filtered current $\hat{i}(t-dt)$ at the preceding time t–dt.

The quantity Q in (5a) stands for the capacity of the accumulator. $a_2$ is a constant of the order of $a_2$=0.3, although it may also be selected in the about 0.05 to about 2.0 range for a lead-acid accumulator.

In general, the constant $a_2$ for calculating the time constant $\tau_2=a_2*Q/\hat{i}$ lies in the value range of from about 0.05 to about 2.0, preferably in the range of from about 0.1 to about 0.5, and the parameters $\hat{u}_1$ and $\hat{u}_2$, respectively, lie approximately in the value range of from about 3 to about 30 mV per cell, preferably in the value range of from about to about 20 mV per cell, and particularly preferably in the value range of from about 7 to about 15 mV per cell.

The numerical low-pass filtering of the flowing current can be carried out by means of software or hardware.

One numerical possibility consists in calculating the output value $F(I, t_n)$ of the filter in the time step n in a weighted fashion from the present current value $I(t_n)$ and the output value $F(I, t_{n-1})$ of the filter in the preceding time step n–1

$$F(I,t_n)=\alpha I(t_n)+(1-\alpha)F(I,t_{n-1})$$

the weighting factor $\alpha$ being selected from the value range 0<$\alpha$<1; small values of $\alpha$, close to 0, entail strong low-pass filtering and large values, close to 1, entail weak lowpass filtering.

Hardware solutions may be implemented, for example, with the aid of an analog RC component.

The input voltage U' of the equivalent circuit diagram is, hence, a voltage that is corrected with respect to the measured battery voltage U, the correction function containing as variables only the current I, the voltage U and the temperature T and as a nonlinear term a logarithmic dependency on I', with I' being obtained from I by low-pass filtering.

By using the equivalent circuit diagram, the instantaneous loading capability, i.e., the response of the battery under a hypothetical load with an assumed current value I, is predicted by imposing this current value I on the equivalent circuit diagram with the found parameters and evaluating the voltage response calculated.

For very fast processes, for example, when starting an internal combustion engine, the replacement circuit diagram from FIG. 1 can be refined yet further to take even the transient response of the first nonlinear term into account $$-Uo-R-(R_{NL1}//C_1)-(R_{NL2}//C_2)-C_S-. \quad (6)$$

Figure 4:
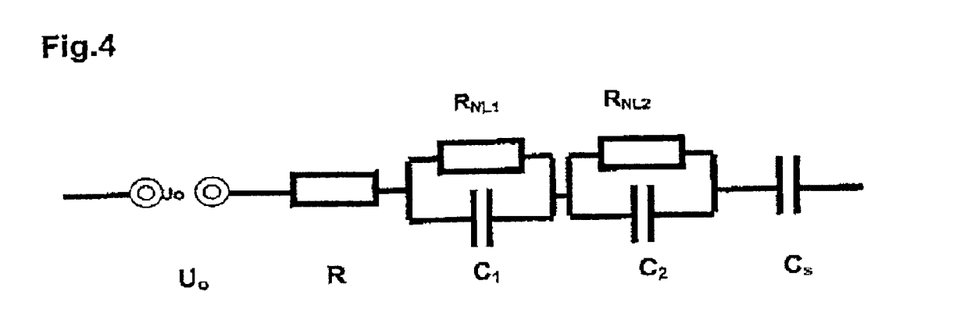
FIG. 4 is still another circuit diagram that may be used in conjunction with selected aspects of the invention.

This is represented in FIG. 4. Then, $$U_{NL}=Uo'+\hat{u}_1*\ln(\hat{i}_1)+\hat{u}_2*\ln(\hat{i}_2).$$

Two half-lives, hence, then need to be taken into account:

$$\tau_1=a_1*Q/\hat{i}_1 \text{ and} \quad (7a)$$

$$\tau_2=a_2*Q/\hat{i}_2. \quad (7b)$$

In general, the parameter $a_1$ of the time constant $\tau_1=a_1*Q/\hat{i}_1$ lies in the value range of from about 0.005 to about 0.2, preferably at approximately 0.05, and the parameter $a_2$ of the time constant $\tau_2=a_2*Q/\hat{i}_2$ lies in the value range of from about 0.05 to about 2, preferably in the value range of from about 0.1 to about 0.5. The parameters $\hat{u}_1$ and $\hat{u}_2$, respectively, lie approximately in the value range of from about 3 to about 30 mV per cell, preferably in the value range of from about 5 to about 20 mV per cell, and particularly preferably in the value range of from about 7 to about 15 mV per cell.

The equivalent circuit diagrams represented in FIGS. 1–4 do not describe all the response modes of an accumulator. Since the current/voltage responses, for example, in a lead-acid accumulator are influenced by additional mechanisms during and after charging, according to the invention a selection is made among the measured-value pairs (U, I) employed for the method. The aim is to ensure that, in particular, nonequilibrium states of the electrodes resulting from previous charging phases have already decayed because the use of measured-value pairs (U, I) from such states in conjunction with the equivalent circuit diagrams represented in FIGS. 1–4 can lead to false results.

In particular, only such measured-value pairs (U, I) are used as lie in a discharge phase, i.e., in which the present current and the current in the preceding measurement are less than zero. It is furthermore ensured that any preceding charging phase (with current values greater than zero) took place sufficiently long ago.

Since the last charging, a charge quantity of at least about 3%, preferably at least about 5% of the capacity of the lead-acid accumulator should have discharged.

Since, in time ranges that are unsuitable for evaluation, for instance quite soon after charging or in the voltage collapse zone of the battery during discharge, the capacitance $C_S$ that is determined takes very small values, the points of a sufficiently negative charge balance can actually be identified by the fact that the matched quantity $C_s$ is greater than a limit value, which is e.g. 3 Ah/V/100 Ah for a 6-cell battery, i.e., 18 Ah/V/cell of 100 Ah capacity.

According to the invention, the quantity Uo is closely related to the thermodynamically balanced open-circuit voltage Uoo of the accumulator. For the difference Uoo–Uo, it is possible to provide a function that generally depends only on the temperature, which can advantageously be written in the form $$Uoo-Uo+a-b/T-c*\ln(Q) \quad (8)$$

and also depends only on the battery type. In this case, a, b and c are constants and T is the absolute temperature, measured in K, and Q is the capacity of the accumulator, measured in Ah.

For a lead-acid accumulator with a rated voltage of 12 V, the following applies, for example $$Uoo-Uo=-1.03\ V+478.8\ V/T-0.13\ V*\ln(Q). \quad (8a)$$

This relationship of Uo to the thermodynamically balanced open-circuit voltage Uoo of the accumulator makes it possible, in the case of a lead-acid accumulator, to deduce its state of charge, because Uoo is linked to it in a way which depends on the construction but is always unequivocal.

For example, the following may be written for the temperature dependency of the steady-state Tafel slope û of a 6-cell lead-acid accumulator in V:

$$\hat{u}=0.088\ V+0.046\ V*\exp(-0.041*TC). \quad (9)$$

In this case, TC is the temperature measured in ° C.

Once the parameters of the components of the equivalent circuit diagram have been found, as described above, then according to the invention it is possible to predict the instantaneous loading capability, i.e., the response of the battery under a hypothetical load with an assumed current value I, by imposing this current value I on the equivalent circuit diagram with the found parameters and evaluating the voltage response calculated. In this case, the current value I(t) may be either constant or dependent on the time t.

The voltage response U(t) calculated in this way is used according to the invention for assessing the electrical loading capability. For example, the electrical power that the accumulator is capable of delivering can be calculated as the product of an assumed imposed current value I(t) and a calculated voltage response U(t).

The use of the matched value Uo directly as an indication that the accumulator has previously been drained is furthermore part of the invention. This previous draining is assumed if Uo exceeds a threshold value Ulimit, depending on the temperature T, during discharge.

In the case of a lead-acid accumulator with 6 cells in series, this threshold value for Uo during discharge lies in the value range of from approximately 11.7 V for 60° C. to approximately 12.2 V for –30° C.

In general, the threshold value Ulimit, depending on the temperature T, is approximately 2.03/cell ±0.03 V/cell at –30° C. and approximately 1.95/cell ±0.03 V/cell at 60° C., preferably approximately 2.03 V/cell ±0.01 V/cell at –30° C. and approximately 1.95 V/cell ±0.01 V/cell at 60° C. For other temperatures, a linear dependency of the threshold value Ulimit on the temperature is assumed.

Another indication that the battery has previously been drained is that the calculated matching parameters for the measurement, in particular the matching parameter for the resistance R, changes greatly in a short time. The failure of an individual cell when a plurality of cells are connected in series can be noticed, inter alia, by the fast decrease dUo/dt of the matched quantity Uo as a function of time.

The fact that the magnitude |dP/dq| of the rate of change of one of the matching parameters P (P=Uo,R,$C_S$) with the transferred charge quantity q exceeds a limit value is used as an indication that the accumulator will be exhausted soon. Whenever |dP/dq| exceeds a threshold value |dP/dq| limit, this is displayed.

In a lead-acid accumulator, the matching parameter P preferably involves the parameter R of the equivalent circuit diagram, and |dR/dq| limit for the lead-acid accumulator is at least approximately 3 times as great as the original value of |dR/dq| for the accumulator when fully charged.

EXAMPLE

Figure 5:
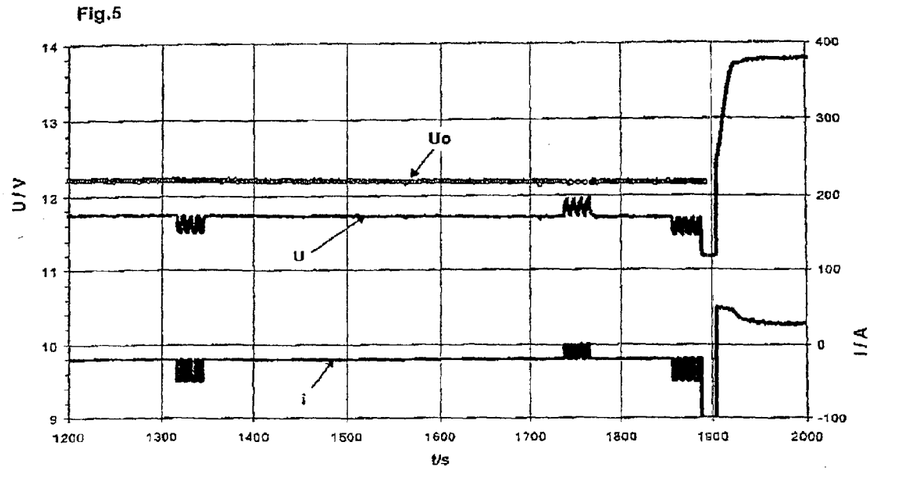
FIG. 5 is a graph of voltage and current versus time for a lead acid battery in conjunction with the equivalent circuit diagram of FIG. 1.

Using the example of a lead-acid battery of 12 V/95 Ah at 0° C., FIG. 5 demonstrates the performance of the method when using the equivalent circuit diagram of FIG. 1 which is reduced, corresponding to the method according to the invention, to the equivalent circuit diagram of FIG. 2. Uo is in this case a quantity determined by the method according to the invention, which is used as a basis quantity for predicting the future response of the accumulator. The time range with large current variations can be matched so well with the parameter R that Uo no longer exhibits any variations over this time range. The Tafel slopes $\hat{u}_1$ and $\hat{u}_2$ used were 0.045 V and 0.09 V.

Figure 6:
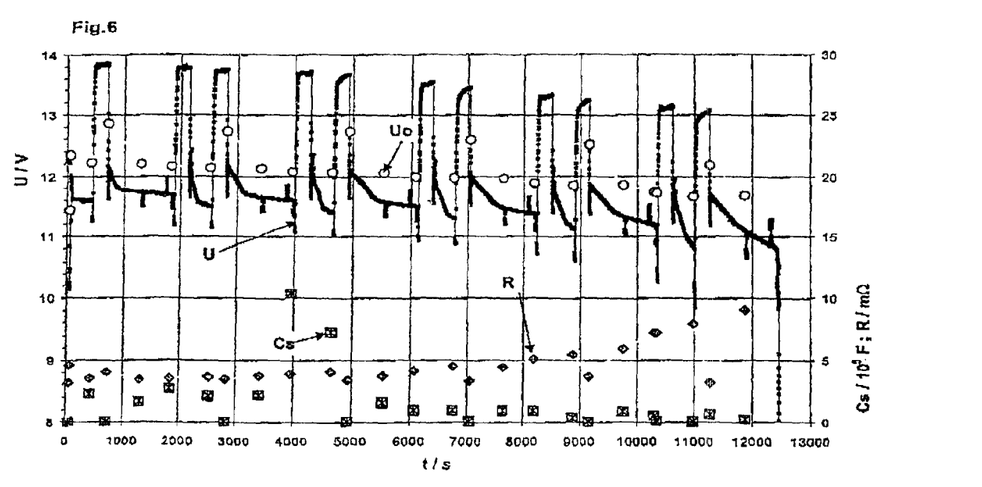
FIG. 6 is a graph of voltage, capacitance and resistance versus time for the lead acid battery of FIG. 5.

FIG. 6 shows the evaluation of a complex current/voltage response according to Uo, R and Cs for the same lead-acid battery. 0.045 V and 0.09 V were applied for the Tafel slopes $\hat{u}_1$ and $\hat{u}_2$. Beside the response of the battery voltage U, FIG. 6 also indicates the values of the matching parameters Uo, R and $C_S$ changing during the discharge time. The selection of the applicable parameter values, that is to say the parameters which belong to a discharge phase and are far enough away in time from a previous charging phase, has not yet been carried out here.

Figure 7:
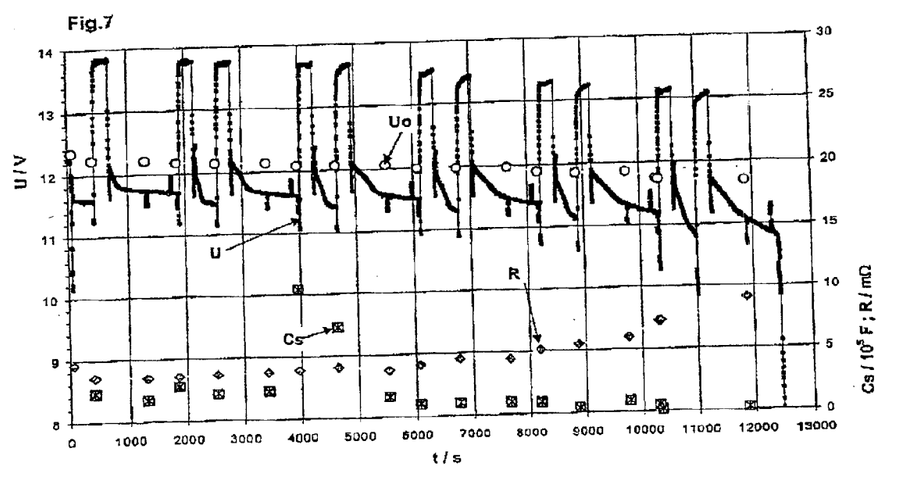
FIG. 7 is another graph of voltage, capacitance and resistance versus time for the lead acid battery of FIG. 5.

If the points for which $C_S$<3 Ah/V (i.e., about 18 Ah/V per cell for the 6-cell accumulator with 95 Ah capacity) are sorted out, then FIG. 7 is obtained. There, the known rise of the linear resistance of the accumulator during discharge can be seen as a quite smooth response. FIG. 7 furthermore shows constant drop of Uo corresponding to the constant depletion of sulfuric acid in the electrolyte of the accumulator.

What is claimed is:

1. A method for predicting loading capability of a battery comprising:

measuring current I, voltage U and temperature T of the battery;

forming an equivalent circuit with an equivalent circuit diagram comprising elements Uo, R, and $C_S$, wherein Uo is voltage at t=o, R is resistance and $C_S$ is capacitance;

correcting input voltage U' of the equivalent circuit diagram with respect to measured battery voltage U, the correcting containing as variables only current I, voltage U and temperature T and as a nonlinear term a logarithmic dependency on I;

varying parameters of components of the equivalent circuit diagram and state variables;

comparing measured values with corresponding values of responses of the equivalent circuit diagram of the battery; and determining the loading capability from matched parameters and state variables.

2. A method for predicting loading capability of a battery comprising:

measuring current I, voltage U and temperature T of the battery;

forming an equivalent circuit with an equivalent circuit diagram comprising elements Uo, R, and $C_S$, wherein Uo is voltage at t=o, R is resistance and $C_S$ is capacitance;

correcting input voltage U' of the equivalent circuit diagram with respect to measured battery voltage U, the correcting containing as variables only current I, voltage U and temperature T and as a nonlinear term a logarithmic dependency on I' , and I' is obtained from I by low-pass filtering;

varying parameters of components of the equivalent circuit diagram and state variables;

comparing measured values with corresponding values of responses of the equivalent circuit diagram of the battery; and determining the loading capability from matched parameters and state variables.

3. The method as claimed in claim 1, wherein correcting the input voltage is achieved with a correction function: u=$\hat{u}$*ln(i), wherein $\hat{u}$ is a fixed parameter and I is current.

4. The method as claimed in claim 3, wherein the battery is a lead-acid battery, and $\hat{u}$ lies in the value range of from about 5 to about 50 mV per cell.

5. The method as claimed in claim 3, wherein the battery is a lead-acid battery, and $\hat{u}$ lies in the value range of from about 10 to about 30 mV per cell.

6. The method as claimed in claim 1, wherein correcting the input voltage is achieved with a correction function: $\hat{u}=\hat{u}_1*\ln(\hat{i})+\hat{u}_2*\ln(\hat{i})$, wherein $\hat{u}_1$ and $\hat{u}_2$ are fixed parameters, i is current, and $\hat{i}$ represents current information filtered from current i with a time constant $\tau_2=a_2*Q/\hat{i}$, wherein Q is storage capacity of the battery and $a_2$ is a constant.

7. The method as claimed in claim 2, wherein correcting the input voltage is achieved with a correction function: $\hat{u}=\hat{u}_1*\ln(i)+\hat{u}_2*\ln(\hat{i})$, wherein $\hat{u}_1$ and $\hat{u}_2$ are fixed parameters, i is current and $\hat{i}$ represents current information filtered from current i with a time constant $\tau_2=a_2*Q/\hat{i}$, wherein Q is storage capacity of the battery and $a_2$ is a constant.

8. The method as claimed in claim 6, wherein the battery is a lead-acid battery and the constant $a_2$ for calculating the time constant $\tau=a_2*Q/\hat{i}$ lies in the value range of from about 0.05 to about 2.0, and wherein the parameters $\hat{u}_1$ and $\hat{u}_2$, respectively, lie approximately in the value range of from about 3 to about 30 mV per cell.

9. The method as claimed in claim 6, wherein the battery is a lead-acid battery and the constant $a_2$ for calculating the time constant $\tau_2=a_2*Q/\hat{i}$ lies in the value range of from about 0.05 to about 2.0, and wherein the parameters $\hat{u}_1$ and $\hat{u}_2$, respectively, lie approximately in the value range of from about 3 to about 30 mV per cell.

10. The method as claimed in claim 6, wherein the battery is a lead-acid battery and the constant $a_2$ for calculating the time constant $\tau_2=a_2*Q/\hat{i}$ lies in the value range of from about 0.1 to about 0.5, and wherein the parameters $\hat{u}_1$ and $\hat{u}_2$, respectively, lie approximately in the value range of from about 5 to about 2 mV per cell.

11. The method as claimed in claim 9, wherein the battery is a lead-acid battery and the constant $a_2$ for calculating the time constant $\tau_2=a_2*Q/\hat{i}$ lies in the value range of from about 0.1 to about 0.5, and wherein the parameters $\hat{u}_1$ and $\hat{u}_2$, respectively, lie approximately in the value range of from about 5 to about 2 mV per cell.

12. The method as claimed in claim 2, wherein the logarithmic dependency is determined from $u=\hat{u}_1*\ln(\hat{i}_1)+\hat{u}_2*\ln(\hat{i}_2)$, wherein $\hat{u}_1$ and $\hat{u}_2$ are fixed parameters, $\hat{i}_1$ and $\hat{i}_2$ represent current information filtered from current i with time constants $\tau_1=a_1*Q/\hat{i}_1$, and $\tau_2=a_2*Q/\hat{i}2$, wherein Q is storage capacity of the battery and $a_1$ and $a_2$ are constants.

13. The method as claimed in claim 12, wherein the battery is a lead-acid battery and a, of the time constant $\tau_1=a_1,*Q/\hat{i}_1$ lies in the value range of from about 0.005 to about 0.2, and the parameter $a_2$ of the time constant $\tau_2=a_2*Q/\hat{i}2$ lies in the value range of from about 0.05 to about 2, and wherein the parameters $\hat{u}_1$ and $\hat{u}_2$, respectively, lie approximately in the value range of from about 3 to about 30 mV per cell.

14. The method as claimed in claim 12, wherein the battery is a lead-acid battery and a, of the time constant $\tau_1=a_1,*Q/\hat{i}_1$ lies in the value range of from about 0.005 to about 0.2, and the parameter $a_2$ of the time constant $\tau_2=a_2*Q/\hat{i}2$ lies in the value range of from about 0.05 to about 2, and wherein the parameters $\hat{u}_1$ and $\hat{u}_2$, respectively, lie approximately in the value range of from about 5 to about 20 mV per cell.

15. The method as claimed in claim 1, wherein the battery is a lead-acid battery and only such measured values are used as occur at operating times of operation in which either a charge quantity of at least about 3%, of the capacity of the lead-acid battery has discharged since last charging, or during which a matched quantity $C_S$ is greater than a limit value of at least about 18 Ah/V/cell of 100 Ah.

16. The method as claimed in claim 2, wherein the battery is a lead-acid battery and only such measured values are used as occur at operating times of operation in which either a charge quantity of at least about 3%, of the capacity of the lead-acid battery has discharged since last charging, or during which a matched quantity $C_S$ is greater than a limit value of at least about 18 Ah/V/cell of 100 Ah.

17. The method as claimed in claim 1, wherein determined quantity Uo is an indication that the battery has previously been drained, and wherein if Uo falls below a threshold value Ulimit, depending on the temperature T, during discharge or exceeds it during charging, this is displayed.

18. The method as claimed in claim 2, wherein determined quantity Uo is an indication that the battery has previously been drained, and wherein if Uo falls below a threshold value Ulimit, depending on the temperature T, during discharge or exceeds it during charging, this is displayed.

19. The method as claimed in claim 1, wherein a magnitude $|dP/dq|$ of rate of change of one of matching parameters P ($P=Uo,R,C_S$) with a transferred charge quantity q exceeds a limit value is an indication that the battery has previously been drained, and wherein whenever $|dP/dq|$ exceeds a threshold value $|dP/dq|$ limit, this is displayed.

20. The method as claimed in claim 19, wherein the battery is a lead-acid battery, parameter P involving parameter R, and $|dR/dq|$ limit for the lead-acid battery is at least approximately 3 times as great as an original value of $|dR/dq|$ for the battery when fully charged.

21. A method as claimed in claim 1, wherein determining the loading capability from match parameters and state variables is conducted for an assumed current value I.

22. A method as claimed in claim 2, wherein determining the loading capability from match parameters and state variables is conducted for an assumed current value I.

* * * * *

UNITED STATES PATENT AND TRADEMARK OFFICE
CERTIFICATE OF CORRECTION

PATENT NO. : 6,909,261 B2
DATED : June 21, 2005
INVENTOR(S) : Helmut Laig-Horstobrock and Eberhard Meissner It is certified that error appears in the above-identified patent and that said Letters Patent is hereby corrected as shown below:

<u>Column 8,</u>
Line 41, insert after the first current -- , --.
Line 46, delete "$\tau=a_2*Q/\hat{\imath}$" and insert therefor -- $\tau_2=a_2*Q/\hat{\imath}$ --.
Line 50, delete "6" and insert therefor -- 7 --.

<u>Column 9,</u>
Line 3, delete "$\hat{u}_2*1n(\hat{\imath}_2,$" and insert therefor -- $\hat{u}_2*1n(\hat{\imath}_2)$, --.
Line 5, insert -- $=a_1$ -- after "$\tau_1$".
Line 10, delete "$\tau_2=a_2*Q/\hat{\imath}2$" and insert therefor -- $\tau_2=a_2*Q/\hat{\imath}_2$ --.

Signed and Sealed this

Eighteenth Day of October, 2005

JON W. DUDAS
*Director of the United States Patent and Trademark Office*